(12) United States Patent
Kitch

(10) Patent No.: US 6,927,160 B1
(45) Date of Patent: Aug. 9, 2005

(54) FABRICATION OF COPPER-CONTAINING REGION SUCH AS ELECTRICAL INTERCONNECT

(75) Inventor: Vassili Kitch, San Ramon, CA (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 10/144,974

(22) Filed: May 13, 2002

Related U.S. Application Data

(62) Division of application No. 09/328,864, filed on Jun. 9, 1999, now abandoned.

(51) Int. Cl.[7] .............................................. H01L 21/28
(52) U.S. Cl. ..................... 438/631; 438/633; 438/637; 438/643; 438/645; 438/675; 438/687; 438/692; 438/695; 438/697; 438/700; 438/760; 438/959
(58) Field of Search ................................ 438/626, 627, 438/631, 633, 637, 639, 643, 645, 675, 687, 690, 692, 695, 696, 697, 700, 760, 778, 959, FOR 355, FOR 388, FOR 403, FOR 35; 204/192.32

(56) References Cited

U.S. PATENT DOCUMENTS

| | | | |
|---|---|---|---|
| 3,911,579 A | 10/1975 | Lane et al. | |
| 4,521,286 A | 6/1985 | Horwitz | |
| 4,643,629 A | 2/1987 | Takahashi et al. | |
| 4,675,096 A | 6/1987 | Tateishi et al. | |
| 4,818,359 A | 4/1989 | Jones et al. | |
| 5,089,442 A | 2/1992 | Olmer | |
| 5,102,821 A | 4/1992 | Mosiehi | |
| 5,240,556 A | 8/1993 | Ishikawa et al. | |
| 5,455,194 A * | 10/1995 | Vasquez et al. | 438/425 |
| 5,712,759 A * | 1/1998 | Saenger et al. | 361/321.4 |
| 5,770,517 A | 6/1998 | Gardner et al. | 438/627 |
| 5,877,078 A | 3/1999 | Yanagida | |
| 5,905,298 A | 5/1999 | Watatani | |
| 5,933,756 A | 8/1999 | Fuse | |
| 5,969,422 A * | 10/1999 | Ting et al. | 257/762 |
| 5,985,762 A * | 11/1999 | Geffken et al. | 438/687 |
| 5,994,206 A * | 11/1999 | Gupta et al. | 438/476 |
| 6,034,434 A | 3/2000 | Bothra et al. | |
| 6,103,581 A * | 8/2000 | Lin et al. | 438/296 |
| 6,106,634 A | 8/2000 | Ghanayem et al. | |
| 6,110,232 A | 8/2000 | Chen et al. | |
| 6,143,662 A * | 11/2000 | Rhoades et al. | 438/690 |
| 6,218,303 B1 * | 4/2001 | Lin | 438/687 |
| 6,265,313 B1 * | 7/2001 | Huang et al. | 438/687 |
| 6,271,121 B1 | 8/2001 | Webb | |
| 6,281,535 B1 * | 8/2001 | Ma et al. | 257/295 |
| 6,287,968 B1 * | 9/2001 | Yu et al. | 438/675 |
| 6,287,977 B1 * | 9/2001 | Hashim et al. | 438/722 |
| 6,440,844 B1 * | 8/2002 | Takagi et al. | 438/637 |
| 6,475,903 B1 * | 11/2002 | Gardner | 438/631 |

OTHER PUBLICATIONS

"SiLK, Product Literature", The Dow Chemical Co., 1995–2004, 2 p.
"SiLK, SiLK Works", The Dow Chemical Co., 1995–2004, 1 p.

* cited by examiner

*Primary Examiner*—George Fourson
*Assistant Examiner*—Joannie Adelle Garcia
(74) *Attorney, Agent, or Firm*—Ronald J. Meetin

(57) ABSTRACT

A copper-containing layer suitable for an electrical interconnect in a device such as an integrated circuit is created by a procedure in which a trench (104) is formed through a dielectric layer (102) down to a substrate (100). A diffusion barrier (106) is provided over the dielectric layer and into the trench. Copper (108) is deposited over the diffusion barrier and into the trench. Chemical mechanical polishing is utilized to remove the copper outside the trench down substantially to the diffusion-barrier material overlying the dielectric layer. A sputter etch, typically of the reactive type, is then performed to substantially remove the diffusion-barrier material overlying the dielectric layer. The sputter etch typically removes copper above and/or in the trench at approximately the same rate as the diffusion-barrier material so as to substantially avoid the undesirable dishing phenomenon.

36 Claims, 4 Drawing Sheets

US 6,927,160 B1

FABRICATION OF COPPER-CONTAINING REGION SUCH AS ELECTRICAL INTERCONNECT

CROSS-REFERENCE TO RELATED APPLICATION

This is a division of U.S. patent application Ser. No. 09/328,864, filed 9 Jun. 1999, now abandoned.

BACKGROUND OF THE INVENTION

1. Field of the Invention

The present invention relates to semiconductor circuit manufacturing and, more specifically, to fabricating copper interconnects in an integrated circuit.

2. Discussion of the Related Art

The active devices of an integrated circuit are interconnected through the use of multilevel interconnects to form functional circuits and components. An example of a technique of forming such interconnects in a multilevel-interconnect system is shown in FIGS. 1 and 2.

FIG. 1 shows an aluminum layer 14 blanket deposited over a silicon dioxide layer 12 which is deposited over a substrate 10. Aluminum layer 14 is then etched by using conventional photolithography to form interconnects 16, as shown in FIG. 2.

Copper is a better conductor material than aluminum because of a lower resistivity, thus allowing higher current densities. Copper also shows a better electromigration resistance. However, copper cannot be etched conventionally. Copper damascene technology has thus been developed for forming copper interconnects.

A conventional copper damascene process is described in reference to FIGS. 3 through 7. FIG. 3 shows a dielectric layer 32 deposited over a substrate 30. Dielectric layer 32 is then etched using conventional photolithography to form trenches 34, as shown in FIG. 4. FIG. 5 shows a diffusion barrier 36 formed over dielectric layer 32 and into trenches 34. Next, a copper layer 38 is deposited over diffusion barrier 36, as shown in FIG. 6.

FIG. 7 shows removal of metals by chemical mechanical polishing (CMP) from dielectric layer 32, except from trenches 34, and formation of interconnects 40 and 41. The portion of diffusion barrier 36 on top of dielectric layer 32 is also removed during the copper CMP process. Because the CMP rate for copper is three times or more higher than the CMP rate for diffusion barrier 36, a phenomenon called dishing results, as shown at the top surfaces of interconnects 40 and 41. Dishing is said to occur when the interconnects exhibit varied topography, e.g., in cross section 44 of interconnect 40, outer edges 43 have higher topography than central portion 45. Dishing is undesirable because thinner copper lines cause undesirable higher current density.

An additional problem caused by polishing off the portion of diffusion barrier 36 on top of dielectric layer 32 during the CMP process is heavy oxidation of the top surface of remaining copper layer 38 due to the oxidizing effect of CMP chemistry, and copper exposure to air. The oxidized copper undesirably increases via resistance. A further concern is contamination of dielectric layer 32 after the portion of diffusion barrier 36 on top of dielectric layer 32 is polished off because copper tends to migrate into the exposed dielectric layer 32.

FIGS. 8 through 12 illustrate double damascene technology which is an extension of the copper damascene process described above. FIG. 8 shows a dielectric layer 48, a nitride layer 50, and a dielectric layer 52 deposited in sequence over the structure of FIG. 7.

A resist (not shown) is deposited and patterned to define contact regions. Dielectric layer 48, nitride layer 50 and second dielectric layer 52 are then etched to form vias 54, as shown in FIG. 9. The resist is removed. A second resist (not shown) is deposited and patterned to define interconnect regions. Dielectric layer 52 is etched selectively with respect to nitride layer 50, forming trenches 56, as shown in FIG. 10. FIG. 11 shows a diffusion barrier 58 blanket deposited over the structure of FIG. 10 and into vias 54 and trenches 56. A copper layer 60 is then deposited over diffusion barrier 58.

FIG. 12 shows formation of interconnects 62 and 63 after CMP and the resulting dishing effect shown by regions 64 and 66, respectively. Interconnects 62 and 63 exhibit worse dishing than that of interconnects 40 and 41, respectively, due to the cumulative effect of dishing. The accumulated dishing causes significant variation in subsequent damascene structure as more metal layers are formed. As a consequence, the aspect ratio, which is defined as the width over the height of the vias, decreases, thereby reducing the process window.

What is needed is a method to fabricate a copper interconnect which does not exhibit dishing, oxidized copper and contaminated dielectric.

SUMMARY OF THE INVENTION

The present invention provides a method of forming copper interconnects that do not exhibit dishing, oxidized copper and contaminated dielectric. A dielectric layer provided above a substrate is etched to form a trench that defines an interconnect region. A diffusion barrier is formed over the patterned dielectric layer and into the trench. A copper layer is then deposited over the diffusion barrier. A first portion of the copper layer is removed by chemical mechanical polishing (CMP) until the top surface of the diffusion barrier is exposed. A sputter etch removes (a) the material of the diffusion barrier overlying the dielectric layer and (b) the oxidized top surface of the copper layer to form a copper interconnect. The sputter etch prevents copper diffusion into the dielectric layer because, by uniformly removing (a) the material of the diffusion barrier overlying the dielectric layer and (b) the oxidized copper, the dielectric material is prevented from contacting the copper. In one embodiment, the sputter etch is performed by sputter etch equipment configured in situ with dielectric deposition equipment.

The present invention is better understood upon consideration of the detailed description below and the accompanying drawings.

BRIEF DESCRIPTION OF THE DRAWINGS

Use of the same reference numbers in different figures indicates similar or like elements.

DETAILED DESCRIPTION

Figure 1:
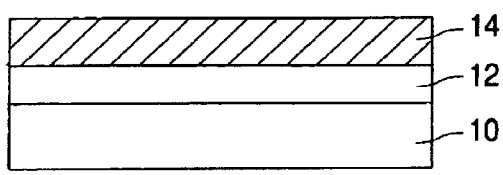
FIGS. 1 and 2 show a prior art process of forming aluminum interconnects.
Figure 2:
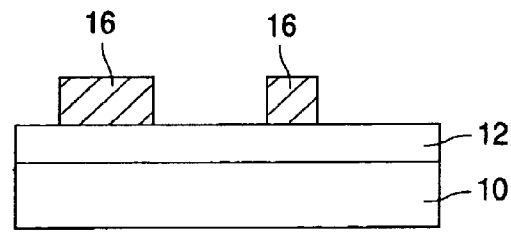
Figure 3:
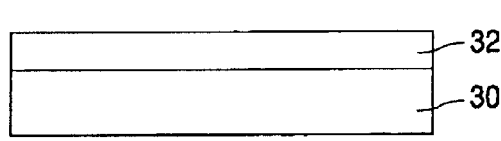
FIGS. 3–12 show a prior art double damascene technology.
Figure 4:
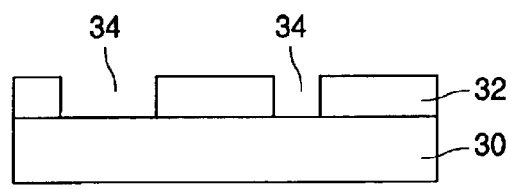
Figure 5:
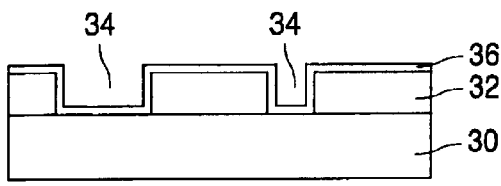
Figure 6:
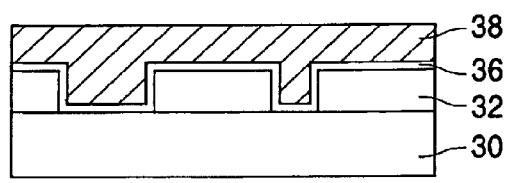
Figure 7:
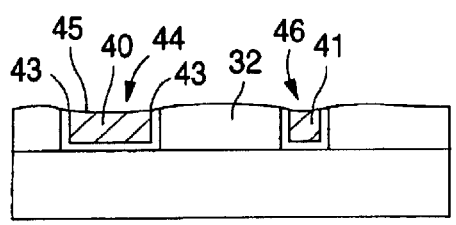
Figure 8:
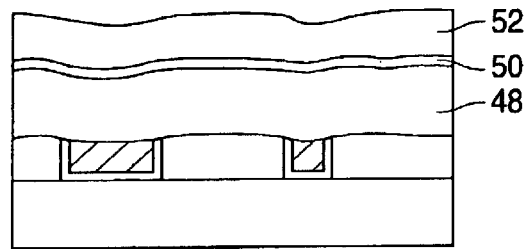
Figure 9:
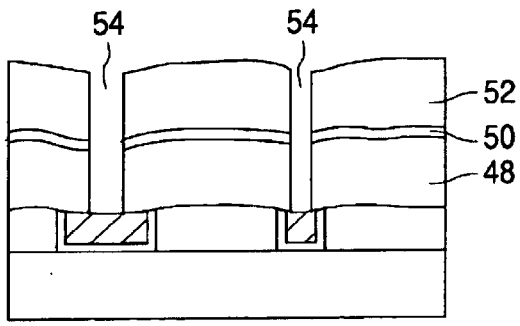
Figure 10:
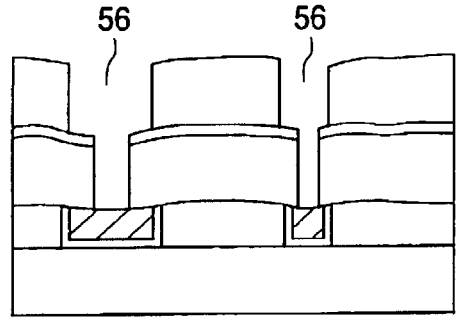
Figure 11:
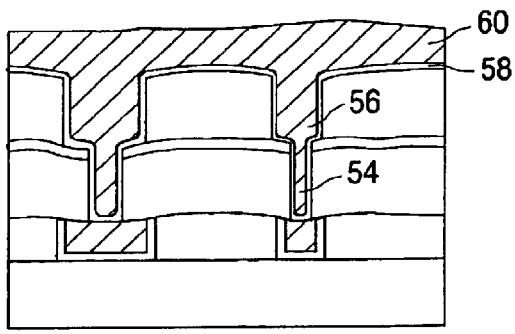
Figure 12:
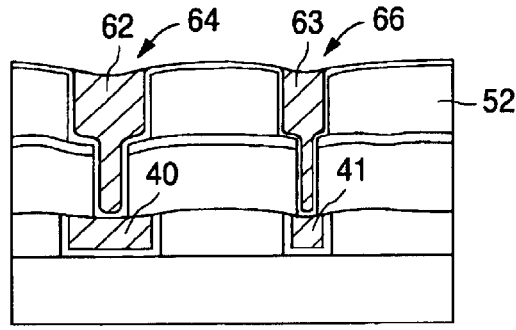
Figure 13:
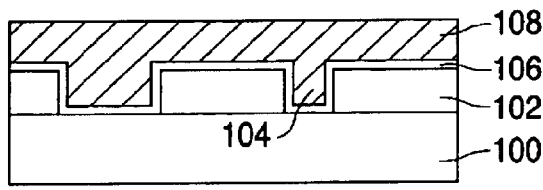
FIGS. 13 through 20 illustrate a dual-damascene process according to the present invention.

The present invention provides a method of forming interconnects that do not exhibit dishing, oxidized copper and contaminated dielectric. With reference to FIGS. 13 through 20, FIG. 13 shows a diffusion barrier 106 and a copper layer 108 deposited in sequence over a patterned dielectric layer 102 provided over a substrate 100. Substrate 100 is typically a semiconductor substrate for forming active and passive devices such as transistors, capacitors and resistors. Some examples of semiconductor substrate materials are silicon, silicon germanium, and gallium arsenide. Substrate 100 can also be a substrate used for a flat panel display.

Dielectric layer 102 is blanket deposited over substrate 100 by a well known technique, such as chemical vapor deposition (CVD). Dielectric layer 102 is made of, but not limited to, silicon dioxide ($SiO_2$). The thickness of dielectric layer 102 is generally determined by the height of the interconnect desired. The final height of the interconnect is determined in the subsequent sputter etch which is discussed later. Dielectric layer 102 typically has a thickness of 4500 Å, depending on the processing environment, such as the product made and technology used.

A photoresist layer (not shown) is then formed over dielectric layer 102 and patterned to define the locations of the interconnects. The exposed portions of dielectric layer 102 are then etched to form interconnect trenches 104. After trenches 104 are formed, the photoresist layer is removed.

Next, diffusion barrier 106 is blanket deposited over patterned dielectric layer 102 and into trenches 104, to a thickness of, e.g., 300 Å. Diffusion barrier 106 prevents a subsequent copper layer from migrating into the underlying dielectric layer 102 and is made of a material such as tantalum (Ta), tantalum nitride (TaN), titanium nitride (TiN), titanium (Ti), tungsten nitride ($WN_x$), or tungsten silicide ($WSi_x$).

Copper layer 108 is blanket deposited, e.g., by an electroplating process, over diffusion barrier 106 to a thickness of, e.g., approximately 6000 Å from the top of dielectric layer 102. The process up to this point is that of a conventional damascene process.

Figure 14:
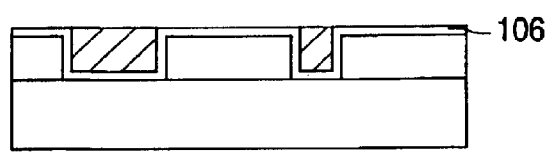

Next, referring to FIG. 14, copper layer 108 is planarized using chemical mechanical polishing (CMP) until the top of diffusion barrier 106 is exposed. The planarization is terminated at a predetermined thickness by endpoint detection specified at the CMP equipment. By stopping the CMP at diffusion barrier 106, no dishing is created by the CMP process because only copper has been processed and the CMP rate for a single material is uniform.

Figure 15:
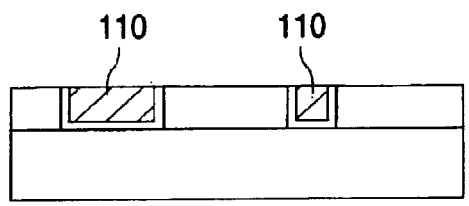

Referring to FIG. 15, the portion of diffusion barrier 106 on top of dielectric layer 102 is then removed by a sputter etch or a reactive sputter etch to form interconnects 110. A sputter etch has the advantage of having an etching rate that varies only slightly from material to material, as compared to the three times or more variation in CMP rate between the diffusion barrier and copper. Thus, diffusion barrier 106 and copper layer 108 are removed at practically the same rate during the sputter etch, resulting in interconnects 110 that exhibit no visible dishing.

Approximately 100 Å of overetch is performed to ensure complete removal of the portion of diffusion barrier 106 on top of dielectric layer 102 across the substrate. The sputter clean also removes damaged portions of the copper surface, i.e., the oxidized copper, and copper contaminants from dielectric layer 102.

In one embodiment, the sputter etch equipment is similar to conventional sputter etch equipment used for contact/via processes, for example, a sputter etch module developed by AMAT (e.g., Endura PC II based hardware). In another embodiment, the sputter etch equipment is configured in situ with a dielectric deposition equipment so that the portion of barrier film 106 on top of dielectric layer 102 is removed in the sputter module and the substrate is then transferred in vacuum to the dielectric deposition module for additional layers. The sputter etch hardware may be configured in situ to allow removal of any redeposited metals on the chamber walls.

Figure 21:
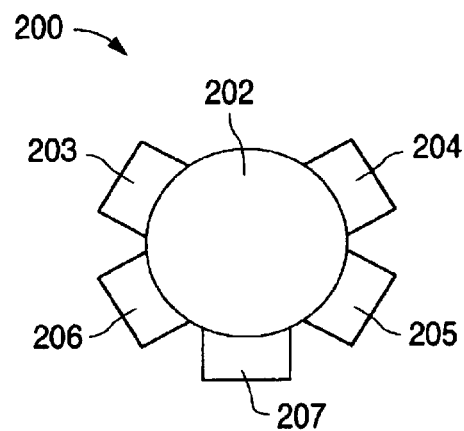
FIG. 21 shows an example of an AMAT CENTURA platform based tool having a plurality of process modules.

FIG. 21 shows an example of AMAT CENTURA platform based tool 200 having a plurality of process modules. The process modules include a sputter etch module and several deposition modules, all integrated on one platform. As can be seen in FIG. 21, AMAT CENTURA platform based tool 200 includes a transfer chamber 202, a plurality of deposition chambers 203 through 205, a sputter clean chamber 206 and a load lock 207. A wafer is transferred between the various chambers through transfer chamber 202 under vacuum so that the wafer surface is not contaminated during wafer transfer. Deposition chambers 203 through 205 contain equipment for, for example, dielectric deposition. Sputter clean chamber 206 contains, for example, Endura PC II based hardware.

A wafer is picked from load lock 207 and transferred under vacuum through transfer chamber 202 to sputter clean module 206 for barrier removal. After completion of the sputter etch, the wafer is transferred under vacuum through transfer chamber 202 to one of the deposition chambers 203 through 205.

Figure 16:
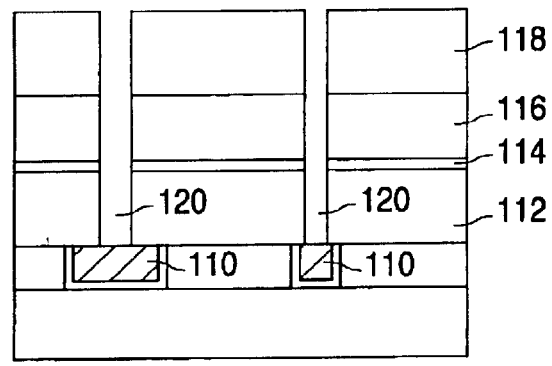

FIG. 16 shows formation of vias 120 through a dielectric layer 112, a nitride layer 114 and a dielectric layer 116 using a first mask 118. Dielectric layer 112, nitride layer 114 and dielectric layer 116 are deposited in sequence over the structure of FIG. 15. Dielectric layer 112 and dielectric layer 116 are made from materials such as silicon dioxide ($SiO_2$), phosphosilicate glass (PSG), borophosphosilicate glass (BPSG), fluorinated silicon dioxide (F—$SiO_2$) or any emerging low dielectric constant material such as, but not limited to, silk and black diamond. The thickness of dielectric layer 112 depends on the height of the contact to be formed and is typically 6000 Å. The thickness of nitride layer 114 is typically 600 Å. The thickness of dielectric layer 116 depends on the height of the interconnect to be formed and is typically 5000 Å.

A photoresist layer 118 is deposited over dielectric layer 116 and patterned to define the locations of the contacts. Dielectric layer 112, nitride layer 114 and dielectric 116 are then etched to form vias 120 over interconnects 110. Photoresist layer 118 is then removed.

Figure 17:
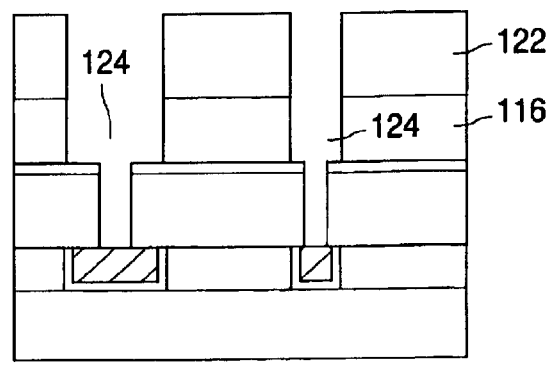

FIG. 17 shows formation of trenches 124 through dielectric layer 116 using a second mask 122. A second photoresist layer 122 is deposited over dielectric layer 116 and patterned to define the locations of the interconnects. Dielectric layer 116 is selectively etched with respect to nitride layer 114, forming trenches 124. Photoresist layer 122 is then removed.

Figure 18:
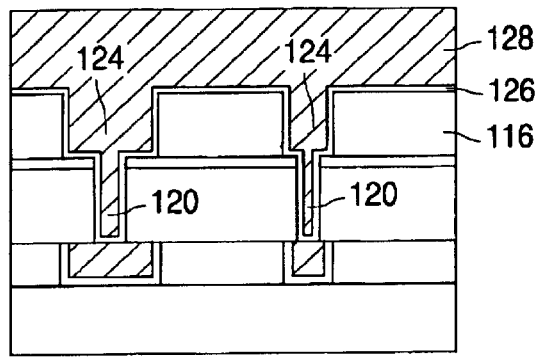
Figure 19:
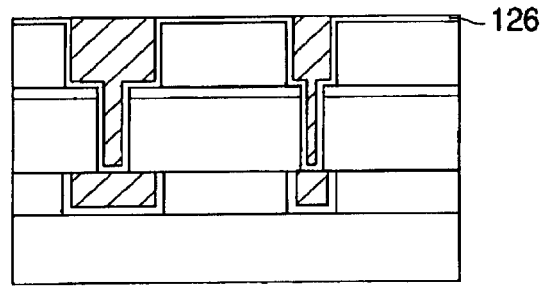
Figure 20:
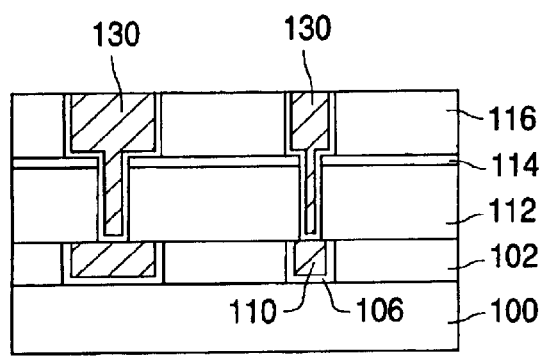

The remaining steps are similar to those described above for FIGS. 13 through 15. FIG. 18 shows deposition of a diffusion barrier 126 and a copper layer 128 over dielectric layer 116 and into trenches 124 and vias 120. FIG. 19 shows CMP of copper layer 128, with diffusion barrier 126 remaining. FIG. 20 shows formation of interconnects 130 after sputter etch to remove the portion of diffusion barrier 126 on top of dielectric layer 116, and completion of the dual damascene formation. Additional layers of interconnects may be formed in a similar manner.

The above detailed description is provided to illustrate the specific embodiments of the present invention and is not intended to be limiting. Numerous variations and modifications within the scope of the present invention are possible. The present invention is defined in the following claims.

I claim:

1. A method comprising:

providing a primary dielectric layer over a substrate;

forming a primary trench through the dielectric layer to expose an underlying portion of the substrate;

forming a primary diffusion barrier over the dielectric layer and into the trench down to the underlying portion of the substrate;

depositing copper over the diffusion barrier and into the trench to form a primary electrically conductive layer;

chemically mechanically polishing the conductive layer to remove copper outside the trench down substantially to material of the diffusion barrier overlying the dielectric layer; and subsequently performing a primary sputter etch to substantially remove the material of the diffusion barrier overlying the dielectric layer.

2. A method as in claim 1 wherein the sputter etch also removes copper above and/or in the trench at approximately the same rate that material of the diffusion barrier overlying the dielectric layer is removed by the sputter etch.

3. A method as in claim 1 wherein the sputter etch also removes copper oxide overlying the copper in the trench.

4. A method as in claim 3 wherein the sputter etch additionally removes copper above and/or in the trench at approximately the same rate that material of the diffusion barrier overlying the dielectric layer is removed by the sputter etch.

5. A method as in claim 1 wherein the material of the diffusion barrier overlying the dielectric layer is removed largely uniformly during the sputter etch.

6. A method as in claim 1 wherein the sputter etch comprises a reactive sputter etch.

7. A method as in claim 1 wherein the substrate comprises a semiconductor substrate, the copper in the trench constituting an electrical interconnect for an integrated circuit that includes the substrate.

8. A method as in claim 1 wherein the dielectric layer comprises at least one of silicon oxide, phosphosilicate glass, borophosphosilicate glass, and fluorinated silicon oxide.

9. A method as in claim 1 wherein the dielectric layer comprises material of low dielectric constant.

10. A method as in claim 1 wherein the dielectric layer comprises at least one of SiLK dielectric resin and black diamond.

11. A method as in claim 1 wherein the dielectric layer comprises:

a first dielectric sublayer overlying the substrate;

a second dielectric sublayer overlying the first dielectric sublayer; and a third dielectric sublayer overlying the second dielectric sublayer, the first and third dielectric sublayers being constituted differently than the second dielectric sublayer.

12. A method as in claim 1 wherein the second dielectric sublayer comprises nitride.

13. A method as in claim 1 wherein the diffusion barrier comprises at least one of tantalum, tantalum nitride, titanium, titanium nitride, tungsten nitride, and tungsten silicide.

14. A method as in claim 1 further including:

providing a dielectric region over the dielectric layer and the copper in the trench;

forming an opening through the dielectric region down to the copper in the trench; and providing electrically conductive material in the opening to contact the copper in the trench.

15. A method as in claim 14 wherein the conductive material in the opening comprises:

a further diffusion barrier provided in the opening down to the copper in the trench; and an electrically conductive region that largely fills the opening above the further diffusion barrier, the conductive region consisting largely of copper.

16. A method as in claim 1 further including:

providing a dielectric region over the dielectric layer and the copper in the trench;

forming an opening through the dielectric region down to the copper in the trench;

forming a further diffusion barrier over the dielectric region and into the opening down to the copper in the trench;

depositing copper over the further diffusion barrier and into the opening to form a further electrically conductive layer;

chemically mechanically polishing the further conductive layer to remove copper outside the opening down substantially to material of the further diffusion barrier overlying the dielectric region; and subsequently performing a further sputter etch to substantially remove the material of the further diffusion barrier overlying the dielectric region.

17. A method as in claim 16 wherein the further sputter etch also removes copper above and/or in the opening at approximately the same rate that material of the further diffusion barrier overlying the dielectric region is removed by the further sputter etch.

18. A method as in claim 16 wherein the further sputter etch also removes copper oxide overlying the copper in the opening.

19. A method as in claim 18 wherein the further sputter etch additionally removes copper above and/or in the opening at approximately the same rate that material of the further diffusion barrier overlying the dielectric region is removed by the further sputter etch.

20. A method as in claim 16 wherein at least one of the sputter etches comprises a reactive sputter etch.

21. A method as in claim 16 wherein the opening comprises:

a via through a lower portion of the dielectric region down to the copper in the trench; and a further trench through an upper portion of the dielectric region down to the via.

22. A method as in claim 21 wherein the substrate comprises a semiconductor substrate, the copper in the trenches respectively constituting a pair of electrical interconnects for an integrated circuit that includes the substrate.

23. A method as in claim 1 further including:

providing a first further dielectric layer over the primary dielectric layer and the copper in the primary trench;

providing a second further dielectric layer over the first further dielectric layer;

forming an opening through the further dielectric layers to create a via through the first further dielectric layer down to the copper in the primary trench;

forming a further trench through the second further dielectric layer down to the first further dielectric layer and down to the via;

forming a further diffusion barrier over the second further dielectric layer and into the further trench and the via down to the copper in the primary trench;

depositing copper over the further diffusion barrier and into the further trench and the via to form a further electrically conductive layer;

chemically mechanically polishing the further conductive layer to remove copper outside the further trench and the via down substantially to the material of the further diffusion barrier overlying the second further dielectric layer; and subsequently performing a further sputter etch to remove material of the further diffusion barrier overlying the second further dielectric layer.

24. A method as in claim 23 wherein the further sputter etch also removes copper above and/or in the further trench at approximately the same rate that material of the further diffusion barrier overlying the second further dielectric layer is removed by the further sputter etch.

25. A method as in claim 23 wherein the further sputter etch also removes copper oxide overlying the copper in the further trench.

26. A method as in claim 25 wherein the further sputter etch additionally removes copper above and/or in the further trench at approximately the same rate that material of the further diffusion barrier overlying the second further dielectric layer is removed by the further sputter etch.

27. A method as in claim 23 wherein the first further dielectric layer comprises:
   a lower dielectric sublayer overlying the primary dielectric layer and the copper in the primary trench; and
   an upper dielectric sublayer overlying, and constituted differently than, the lower dielectric sublayer.

28. A method as in claim 23 wherein the substrate comprises a semiconductor substrate, the copper in the trenches respectively constituting a pair of electrical interconnects for an integrated circuit that includes the substrate.

29. A method comprising:
   providing a dielectric layer over a substrate;
   forming an opening through the dielectric layer to expose an underlying portion of the substrate;
   forming a diffusion barrier over the dielectric layer and into the opening down to the underlying portion of the substrate;
   depositing copper over the diffusion barrier and into the opening to form an electrically conductive layer;
   chemically mechanically polishing the conductive layer to remove copper outside the opening down substantially to material of the diffusion barrier overlying the dielectric layer; and
   subsequently performing a sputter etch to substantially remove the material of the diffusion barrier overlying the dielectric layer.

30. A method as in claim 29 wherein the sputter etch also removes copper above and/or in the opening at approximately the same rate that material of the diffusion barrier overlying the dielectric layer is removed by the sputter etch.

31. A method as in claim 29 wherein the sputter etch also removes copper oxide overlying the copper in the opening.

32. A method as in claim 31 wherein the sputter etch additionally removes copper above and/or in the opening at approximately the same rate that material of the diffusion barrier overlying the dielectric layer is removed by the sputter etch.

33. A method as in claim 29 wherein the material of the diffusion barrier overlying the dielectric layer is removed largely uniformly during the sputter etch.

34. A method as in claim 29 wherein the sputter etch comprises a reactive sputter etch.

35. A method as in claim 29 wherein the dielectric layer comprises:
   a first dielectric sublayer overlying the substrate;
   a second dielectric sublayer overlying the first dielectric sublayer; and
   a third dielectric sublayer overlying the second dielectric sublayer, the first and third dielectric sublayers being constituted differently than the second dielectric sublayer.

36. A method as in claim 29 wherein the diffusion barrier comprises at least one of tantalum, tantalum nitride, titanium, titanium nitride, tungsten nitride, and tungsten silicide.

* * * * *